(12) United States Patent
Anderson

(10) Patent No.: US 7,006,643 B2
(45) Date of Patent: Feb. 28, 2006

(54) DIFFERENTIAL AUDIO AMPLIFICATION SYSTEM

(75) Inventor: Jeffrey S. Anderson, Camas, WA (US)

(73) Assignee: Logitech Europe S.A., (CH)

( * ) Notice: Subject to any disclaimer, the term of this patent is extended or adjusted under 35 U.S.C. 154(b) by 803 days.

(21) Appl. No.: 09/877,689

(22) Filed: Jun. 8, 2001

(65) Prior Publication Data

US 2002/0186853 A1    Dec. 12, 2002

(51) Int. Cl.
*H03F 21/00* (2006.01)
(52) U.S. Cl. ...................................... 381/120
(58) Field of Classification Search ............... 381/120, 381/98, 103; 330/252, 258
See application file for complete search history.

(56) References Cited

U.S. PATENT DOCUMENTS 4,321,428 A * 3/1982 Seki ........................ 381/120
6,531,845 B1 * 3/2003 Kerai et al. ................. 320/107
2001/0043468 A1 * 11/2001 Krietzman et al. ............ 362/85

* cited by examiner

*Primary Examiner*—Brian T. Pendleton
(74) *Attorney, Agent, or Firm*—Ipsolon LLP (57) ABSTRACT

A universal host-powered multimedia speaker system derives its power from a host multimedia computer system chassis, rather than from a conventional dedicated speaker system power supply. The speaker system includes a pair of amplifiers with differential connections for receiving the audio signal and with differential output connections to the speaker to provide it with differential amplification. Differential input amplification amplifies the difference between the signals applied to the amplifiers and thereby rejects the common-mode noise, which including ground circuit electrical noise. Differential output amplification refers to a pair of amplifiers that generate output signals that are 180 degrees out of phase with each other. The differential output amplification provides rejection of power supply electrical noise components. This differential input/differential output host computer-powered speaker system provides low noise, high quality audio playback for multimedia speaker systems deriving power from the host multi-media computer system.

26 Claims, 5 Drawing Sheets

DIFFERENTIAL AUDIO AMPLIFICATION SYSTEM

FIELD OF THE INVENTION

The present invention relates to multimedia computer speaker systems that play audio signals provided by host multimedia computers and, in particular, to such a system that is powered directly by such a host computer system.

SUMMARY OF THE INVENTION

Speaker systems with integral amplification electronics provide simple, compact audio playback for multimedia personal computers. These speaker systems, sometimes referred to as multimedia computer speaker systems, typically include pairs of wide-band speakers mounted in separate housings with amplification electronics incorporated into one or both housings. Because compactness is desirable, small, wide-band speakers (e.g., 3-inch diameter cone speaker drivers) are commonly used.

Many conventional multimedia computer systems include two-channel (stereo) multimedia computer speaker systems. Typically, a conventional two-channel computer audio system includes a two-channel audio system control circuit, which is commonly configured as a separate computer expansion board called a "sound card," and two wide-band audio transducers or speakers. A sub-woofer audio transducer or speaker is also included in many implementations. Conventional two-channel speaker systems are configured to provide at the two wide-band speakers distinct audio playback according to two distinct audio channels included in a multimedia computer work such as a game, music, etc.

Computer systems and associated multimedia computer speaker systems are distributed throughout the world. Nearly all countries of the world have differing combinations of input voltage and frequency and regulatory approvals. Major computer system components, such as the central processing unit, usually have a universal input switch-mode power supply with universal regulatory approvals. These supplies have large power capacities (e.g., 200 to 400 watts) and easily absorb the additional electronics required for universal connectivity. In contrast, speaker systems are comparatively inexpensive and so the additional costs of universal supplies not affordable. As a consequence, the cost-optimized solution for speaker systems that are distributed world-wide is to use a unique power supply for each country of distribution. While being cost effective, this imposes extremely cumbersome product distribution complications for original equipment computer manufacturers, as well as other distributors.

One aspect of the present invention is a universal host-powered multimedia speaker system that derives its power from a host multimedia computer system chassis, rather than from a conventional dedicated speaker system power supply. This can be achieved by a custom power jack provided by the PC manufacturer for use by the speaker system, or use of power that is available on the pins of ports already available on the PC such as sound card game ports, the Universal Serial Bus (USB) ports, or the IEEE 1394 ports. The power is provided by the host computer system power supply, so the need for a separate external power supply or adapter is eliminated.

Another aspect of this invention addresses the audio performance consequences of the greater electrical noise in a conventional computer power supply in comparison to a dedicated speaker system power supply. In particular, a conventional computer power supply system has much more electrical noise than a standard dedicated speaker system power supply or adapter.

Conventional computer system supply voltages include high-frequency electrical noise, which is caused by the varying current draws of hard drives, disk drives CPU chipsets, etc. While low frequency noise can be reduced by coupling most amplifier integrated circuits to relatively expensive large value electrolytic decoupling capacitors, such a configuration will still allow high frequency noise components to pass to the powered system because the high frequency components of the power signal are usually quite large and large value capacitors generally have poor high frequency rejection. In the case of multimedia computer speaker systems, such electrical noise can cause undesirable audible high-frequency noises to be generated by the powered speakers.

Additionally, other audible noise components can arise from differences between the electrical grounds for the audio electrical signal and the host power source for the speaker system. In particular, noise can be generated because of voltage differences between the two ground locations arising from the different currents flowing through the grounds and their finite impedances. A typical multimedia speaker system design cannot reject this ground difference electrical noise, and so will amplify the noise signal and play it as undesirable audio output.

Accordingly, another aspect of this invention is a multimedia computer speaker system having a pair of amplifiers with differential connections for receiving the audio signal and with differential output connections to the speaker to provide it with differential amplification. Differential input amplification amplifies the difference between the signals applied to the inputs of amplifiers and thereby rejects the common-mode noise, which includes electrical noise from differences between the electrical grounds for the audio electrical signal and the host power source.

Differential output amplification refers to a pair of amplifiers that generate output signals that are 180 degrees out of phase with each other. A load, such as a computer speaker, which is tied between and receives such signals is said to be driven differentially or a "bridge-tied load." This differential output amplification provides rejection of power supply electrical noise components. As a result, a differential input/differential output of the present invention allows a host computer-powered speaker system to provide low noise, high quality audio playback when used as a host powered speaker system.

Additional objects and advantages of the present invention will be apparent from the detailed description of the preferred embodiment thereof, which proceeds with reference to the accompanying drawings.

DETAILED DESCRIPTION OF THE PREFERRED EMBODIMENT

Figure 1:
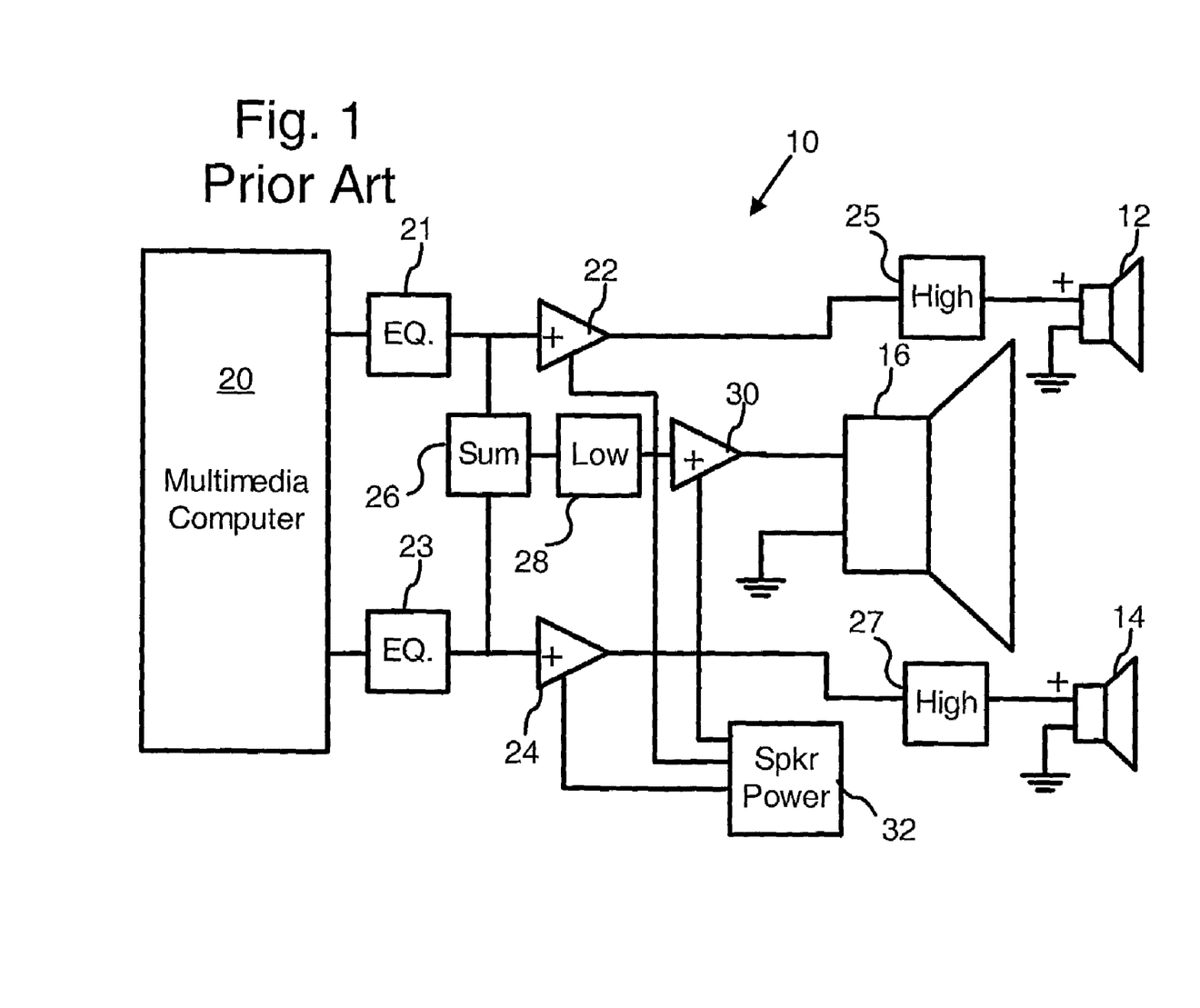
FIG. 1 is a simplified block diagram of a prior art three-piece multimedia computer speaker system coupled to a computer such as a personal computer.

FIG. 1 is a simplified block diagram of a prior art three-piece multimedia computer speaker system 10, which includes a pair of amplified wide-band speakers 12 and 14 and a sub-woofer 16. Speakers 12 and 14 and subwoofer 16 are commonly contained within separate housings with speakers 12 and 14 sometimes referred to as satellite speakers. Speaker system 10 receives an audio signal from an audio output circuit (e.g., a "sound card," not shown) of a multimedia computer 20. Typically, the audio signal is a stereo audio signal that includes separate right and left audio channels that are applied to speakers 12 and 14, respectively. Speaker system 10 includes pair of equalizers 21 and 23 and a pair of amplifiers 22 and 24 that provide amplified right and left audio signals through high pass filters 25 and 27 to respective speakers 12 and 14.

Sub-woofer 16 receives an audio signal that typically is generated from the right and left audio channels. In particular, the right and left audio channels are passed to an adder or mixer 26 that sums the audio channels. The sum of the audio channels is passed through a low pass filter 28 to a sub-woofer amplifier 30 that is coupled to sub-woofer 16. As a result, subwoofer 16 is driven with a sum of the low-frequency components of the right and left audio channels. Speaker system 10 also commonly includes a volume control, such as a ground-connected potentiometer (not shown), that coupled somewhere between amplifiers 22, 24, and 30 and the sound card of host multimedia computer 20 to control the volume of audio playback provided by speaker system 10.

Conventional prior art speaker system 10 typically includes a dedicated power supply 32 that supplies power to each of amplifiers 22, 24, and 30 and the other electrical components of speaker system 10 (only the power connections to amplifiers 22, 24, and 30 are shown). Typically, dedicated power supply 32 is a DC power supply that is configured as a cubic block, sometimes called a "brick," with a rigidly integral plug that is inserted into a conventional AC power socket. Many other configurations of dedicated, stand-alone power supply 32 are known as well as integrated power supplies that may be included inside the enclosure of speaker system 10.

While simple and relatively convenient for a user, dedicated power supply 32 can pose significant product distribution and logistics difficulties if speaker system 10 is to be distributed or sold world-wide. The problem is that nearly every country has a different combination of input voltage and frequency and regulatory approvals. As a result, a unique power supply 32 with distinct input power and regulatory certifications is typically required for each country. This can add significant logistical complication and expense to the distribution of speaker systems 10 or other products, such as multimedia computers, that might be distributed with speaker systems 10.

Figure 2:
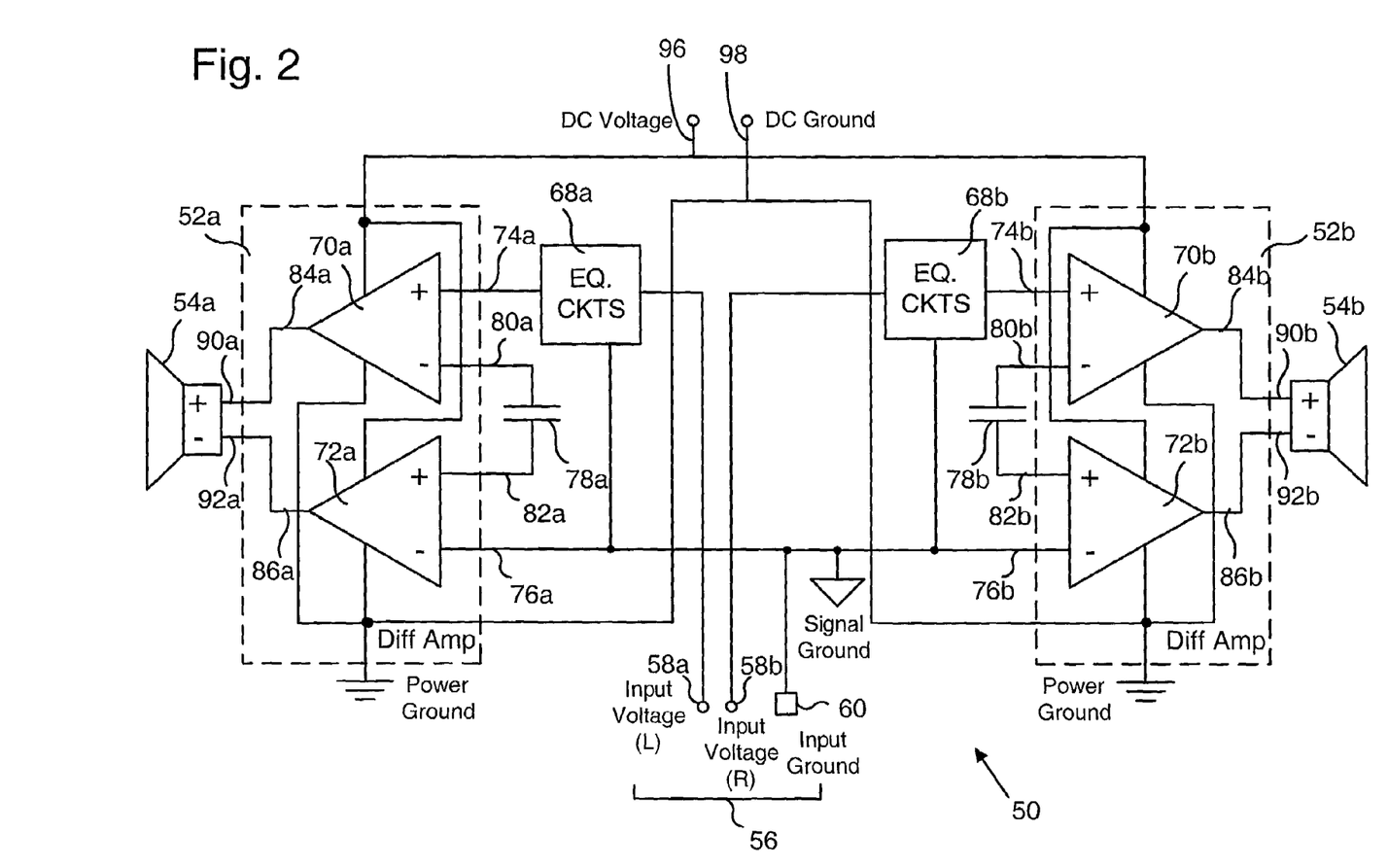
FIG. 2 is a simplified block diagram of a universal host-powered multimedia speaker system that includes a differential input/differential output (DIDO) speaker driver system according to the present invention.

FIG. 2 is a simplified block diagram of a universal host-powered multimedia speaker system 50 that includes a differential input/differential output (DIDO) speaker driver system 52a and 52b for each of an exemplary pair of wideband speakers 54a and 54b. It will be appreciated that host-powered speaker system 50 could alternatively be employed in a three-piece speaker system, analogous to speaker system 10 and including a sub-woofer speaker, or in a speaker system with more speakers. In one implementation, a DIDO amplification system 52 would be associated with and drive each speaker.

In the illustration of FIG. 2, DIDO speaker driver systems 52a and 52b have the same components, which are designated by common reference numerals and the suffices "a" and "b." While directed primarily to DIDO speaker driver system 52a and speaker 54a, the following description is similarly applicable to DIDO speaker driver system 52b and speaker 54b.

Host-powered speaker system 50 receives an audio signal at an audio input 56 from a multimedia audio circuit (e.g., a "sound card") of a multimedia computer, such as a personal computer (not shown). The audio signal is typically one channel of a multi-channel (e.g., stereo) audio signal that includes at least separate right and left audio channels.

In the illustrated stereo implementation, audio input 56 includes a left channel audio voltage input 58a and a right channel audio voltage input 58b that are directed to respective DIDO speaker driver systems 52a and 52b. Audio input 56 also includes an audio input ground 60. Audio input 56 may be connected to a multimedia audio circuit in any conventional manner, such as with a single prong "mini-jack" plug in which inputs 58a, 58b, and 60 are positioned coaxially with each other, or with any other audio system connecting device.

DIDO speaker driver system 52a includes an equalizer 68a and a pair of amplifiers 70a and 72a that are connected together in a differential input-differential output configuration. Equalizer 68a may be of a conventional type. Amplifier 70a receives the audio signal at a positive input terminal 74a, and amplifier 72a has its negative input terminal 76a connected to audio input ground 60. Amplifiers 70a and 72a are coupled through a capacitor 78a connected at their respective negative and positive input terminals 80a and 82a and so will amplify only the difference between the signal source and the signal ground. As known in the art, it should be recognized that the circuit represented here is not the only way to build a differential input amplifier.

Outputs 84a and 86a of amplifiers 70a and 72a are connected to speaker 54a at its positive terminal 90a and negative terminal 92a, respectively. As known in the art, it should be recognized that the circuit represented here is not the only way to build a differential output amplifier. DIDO speaker driver system 52a would typically include a volume-control circuit element, as known in the art, such as a ground-connected potentiometer (not shown) at audio input 58a.

Host-powered speaker system 50 further includes a host DC voltage input 96 and a host DC ground input 98 that are connected to available DC voltage and DC ground output connections on the multimedia host computer from which the audio signal is received. In one implementation, for example, host DC voltage input 96 and a host DC ground input 98 that are connected to available DC voltage and DC ground output connections of conventional audio or sound subsystems (e.g., "sound cards"), a dedicated host power output jack, or power available from a standard data port on the host such as a USB jack. Amplifiers 70a and 72a each include DC power and DC ground terminals that are connected to the corresponding host DC voltage input 96 and host DC ground input 98.

Host DC voltage input 96 and a host DC ground input 98 allow speaker system 50 to be powered by its hosting multimedia computer system, thereby eliminating the requirement for a relatively expensive stand-alone power supply. As a result, host-powered speaker system 50 can be used universally with multimedia computer systems in different countries having different electric power conventions, thereby eliminating a separate speaker system power supply that is specifically adapted for each electric power convention.

Host DC ground input 98 is connected to a DC ground of the multimedia host computer power system, and audio input ground 60 an audio ground of the host computer audio system. As described below in greater detail, the DC ground of the multimedia host computer power system includes a noise component. In addition, the DC ground of the multimedia host computer power system and the audio ground of the host computer audio system will typically have electrical voltage differences, thereby creating a ground circuit noise component between them.

Such noise components in a conventional audio amplifier configuration will cause undesirable audio artifacts at speaker 54a. The differential input/differential output amplification configuration of DIDO speaker driver system 52a compensates for these noise components, and thereby allows DIDO speaker driver system 52a to utilize universal host power while providing high-quality, low noise audio playback.

Figure 3:
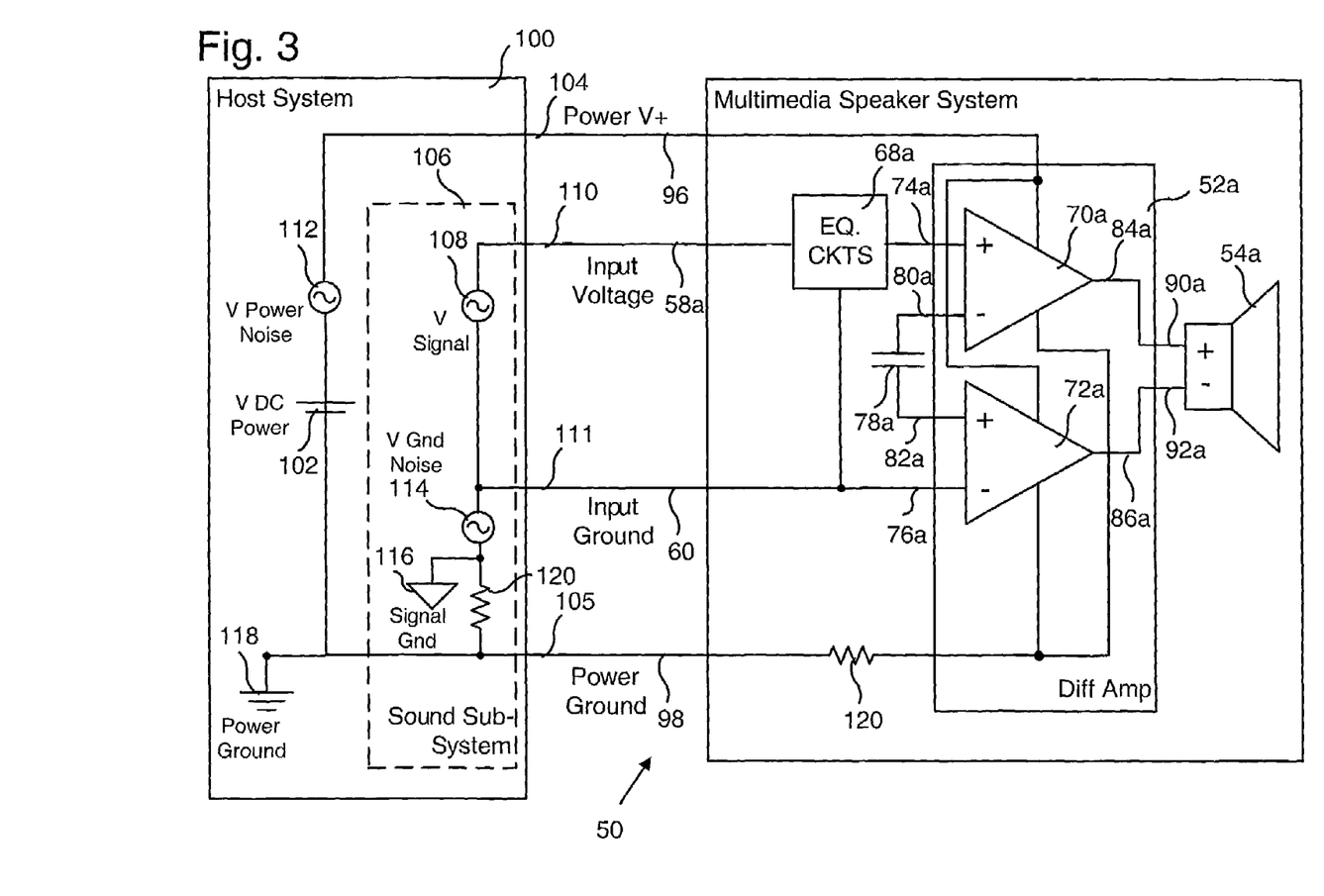
FIG. 3 is simplified block diagram of a differential input/differential output speaker driver system and an associated multimedia host computer system with representations of exemplary noise component sources.

FIG. 3 is simplified block diagram of a single DIDO speaker driver system 52a and a multimedia host computer system 100. It will be appreciated that the following description of DIDO speaker driver system 52a is exemplary and applicable to each such speaker system that is coupled to host computer system 100. Moreover, it will be appreciated that the representation of host computer system 100 is highly schematic and limited to power and audio system components relevant to the following explanation of DIDO speaker driver system 52a. Host computer system 100 would include all components required of a multimedia computer system.

Host computer system 100 as illustrated includes a power supply 102, designated V DC Power, in communication with a power output 104 and a power ground output 105 to which respective host DC voltage input 96 and host DC ground input 98 of DIDO speaker driver system 52a are connected. For example, power output 104 may be implemented as a socket on host computer system 100 on an audio card or sound sub-system 106, or at another socket location (the latter illustrated) such as a dedicated power port or a conventional data port that supplies DC power such as a USB jack. Sound sub-system 106 includes an audio signal source 108, designated V Signal, which generates an audio signal that is delivered at an audio output 110 with an audio ground output 111 for respective signal input 58a and input ground line 60 of DIDO speaker driver system 52a.

Host computer system 100 is modeled as including a power supply noise source 112, designated V Power Noise, that represents electrical noise that is carried on power supply 102. Power supply noise 112 may correspond to any or all of the noise voltage on the positive power rail or bus generated from the current draw of the digital, analog, and mechanical parts in host computer system 100 being dropped across the finite output impedance of power supply 102, the finite impedance of host computer system 100 power wiring, and noise generated from power supply 102 itself.

Sound sub-system 106 is modeled as including a ground noise source 114, designated V Gnd Noise, that represents the electrical noise difference between the sound sub-system ground 116 and the DC power ground 118 in host computer system 100. Ground noise 114 is generated from the current of the digital, analog, and mechanical parts in host computer system 100 flowing through the finite ground impedances 120 of the system.

The non-inverting and inverting amplification provided by respective amplifiers 70a and 72a, together with the coupled inputs 80a and 82a, cause amplifiers 70a and 72a operate in a differential input manner. Differential input amplification amplifies the difference between the signals applied to respective inputs 74a and 76a, such as the differential voltage across audio signal source 108. Differential amplifier theory then states that the common-mode noise corresponding to ground noise 114 will be rejected because it is common to both of amplifier inputs 74a and 76a via input signal line 58a and input ground line 60, respectively.

Differential output amplification refers to a pair of amplifiers (e.g., amplifiers 70a and 72a) that generate output signals that are completely (i.e., 180 degrees) out of phase with each other, and a load such as speaker 54a tied between and receiving such signals is said to be driven differentially or a "bridge-tied load." This differential output amplification in DIDO speaker driver system 52a provides rejection (i.e., cancellation) of power supply noise 112 due to the fact that both amplifiers 70a and 72a will amplify power supply noise in the same manner and phase because they are amplifiers of identical construction and connection to the power supply.

As a result, both amplifier outputs 84a and 86a will have the identical power supply noise signal on them. Since the driver is connected across the amplifier outputs, the noise is then common-mode to the driver. As a result, DIDO speaker driver system 52a provides cancellation of both common-mode ground noise 114 and power supply noise 112, thereby providing improved audio output fidelity in combination with the convenience of universal host-powered operation. Such a combination can significantly decrease the costs of multimedia computer speaker systems by eliminating the many different power supply configurations that are otherwise required for distribution in a wide variety of countries.

Figure 4:
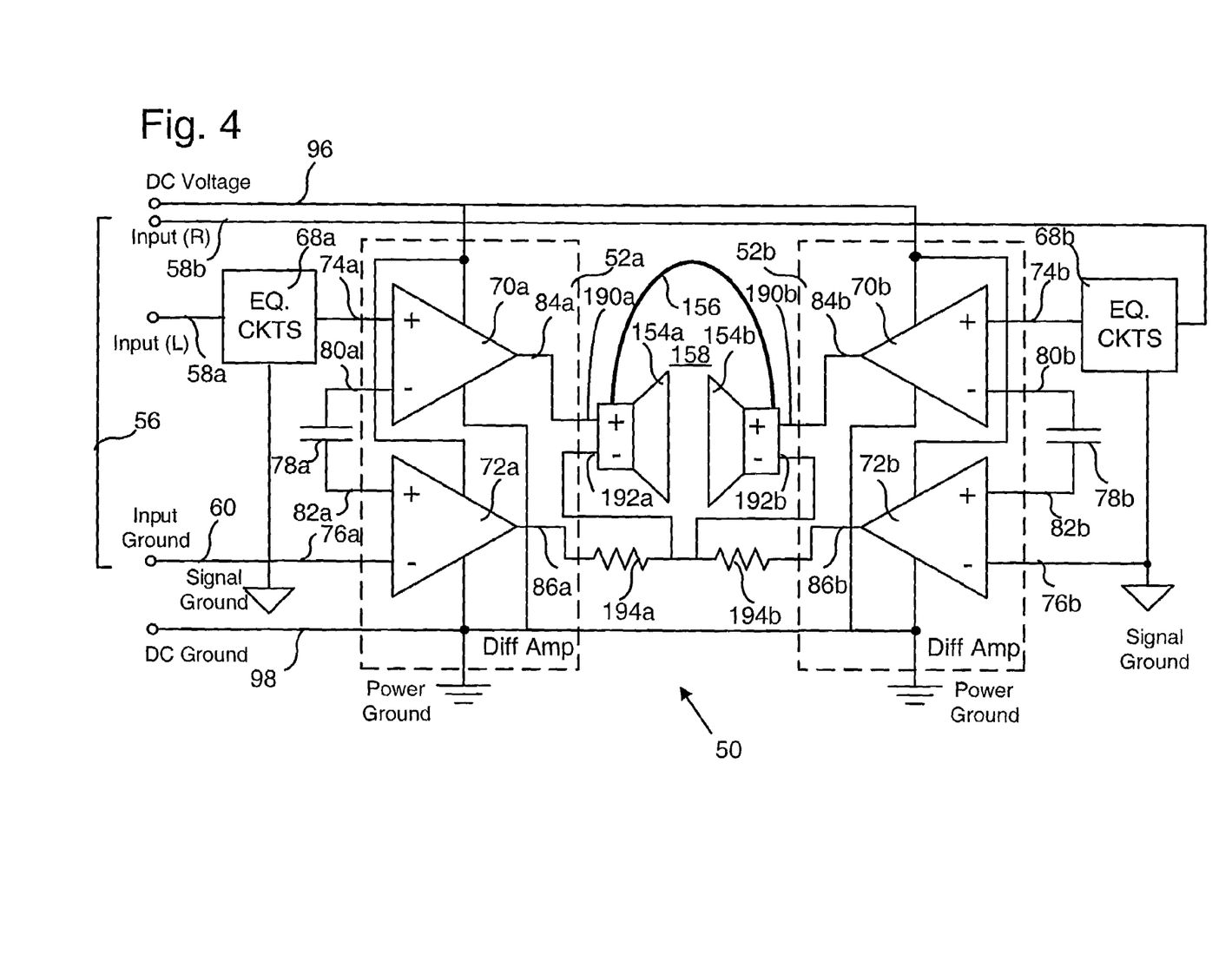
FIG. 4 is a simplified block diagram of a differential stereo audio amplification system shown coupled to a stereo headphone.

FIG. 4 is a simplified block diagram of a differential stereo audio amplification system 150 that includes a differential input/differential output (DIDO) audio driver system 52a and 52b for each of an exemplary pair of headphone speakers 154a and 154b. Speakers 154a and 154b are commonly contained within separate earpiece housings (not shown) that may be joined by a headband 156, or a neckband, wires, etc. to form a headphone 158. DIDO speaker driver systems 52a and 52b are redrawn relative to the illustration of FIG. 2 to show with better clarity the connection to headphone 158. The description of DIDO speaker driver systems 52a and 52b referencing FIG. 2 is similarly applicable to audio amplification system 150.

As with multimedia speaker system 50, positive output 84a of amplifier 70a is connected to speaker 154a at its positive terminal 190a. However, negative output 86a of amplifier 72a is connected through a resistor 94a to negative terminals 192a and 192b of respective speakers 154a and 154b. Speakers 154a and 154b may be connected to DIDO speaker driver system 52a and 52b in any conventional manner, such as with a single prong "mini-jack" plug in which couplings that are positioned coaxially with each other, or with any other audio system connecting device.

Resistors 194a and 194b function to sum together the voltages on outputs 86a and 86b of amplifiers 72a and 72b, which sum is applied to speakers 154a and 154b as a common "ground." In one implementation, resistors 194a and 194b have the same impedance as speakers 154a and 154b, so that a natural virtual ground or virtual voltage common is established at terminals 192a and 192b to prevent current from flowing between DIDO speaker driver systems 52a and 52b. Thus, full normal stereo operation can be provided with the noise rejection properties and no risk of damage to the amplifiers.

It will be appreciated that alternative implementations could employ other impedances for resistors 194a and 194b. For example, different impedance values for resistors 194a and 194b can provide an "enhanced stereo" feature, which is illustrated by way of an exaggerated example. If resistors 194a and 194b have the same very high impedance relative to speakers 154a and 154b, current will no longer flow to inverting amplifier outputs 86a and 86b from speaker terminals 192a and 192b. Instead, current will flow between non-inverting amplifier outputs 90a and 90b.

As a result, left speaker 154a will play an audio signal represented as L-R corresponding to the difference between the left and right audio channels, and right speaker 154b will play an audio signal represented as R-L corresponding to the difference between the right and left audio channels. As a result, all common mode (i.e., "mono") audio signal will be canceled out. In less exaggerated implementations, the common mode audio signal can be partly cancelled, thereby resulting in a relative enhancement of stereo mode audio, with corresponding improvement in the perceived audio characteristics.

Figure 5:
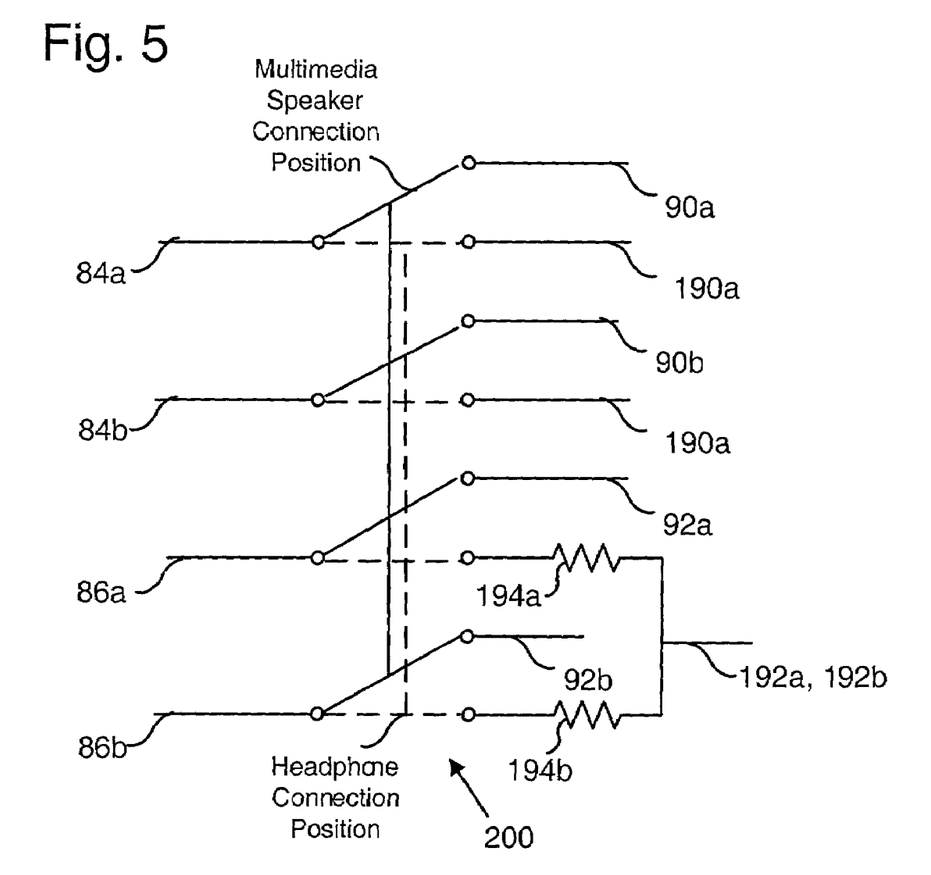
FIG. 5 is a schematic diagram of a switch mechanism for switching a differential stereo audio amplification system between couplings to a multimedia speaker system and a headphone.

FIG. 5 is a schematic diagram of a switch mechanism 200 for switching audio amplification system 150 (or 50) between couplings to multimedia speakers 54 or to a headphone 158. For example, switch mechanism 200 may be operated by action of connecting an electrical jack (not shown) for headphone 158 into a corresponding plug that is coupled to amplification system 150 and incorporated into a multimedia speaker system. Alternatively, switch mechanism may be controlled in any alternative manner, as is known in the art.

Switch 200 is illustrated by solid lines as being in a multimedia speaker connection position for coupling audio amplification system 150 (or 50) to multimedia speakers 54, which are indicated the reference numerals for the corresponding speaker terminals. Dashed lines indicate an alternative headphone connection position by which switch mechanism 200 may couple audio amplification system 150 (or 50) to speakers 154 of headphone 158, as indicated the reference numerals for the corresponding speaker terminals. As indicated, switch mechanism 200 accommodates the connections between resistors 194 in the headphone connection position.

Many conventional power amplifier integrated circuits offer signal ground pins that are separated from the integrated power ground pins. DIDO speaker driver system 52a may be implemented with any type of amplifier integrated circuit that provides access, or pseudo access, to both inverting and non-inverting inputs of differential gain stages, including standard "ground sensing" operational amplifier integrated circuits and many standard audio amplifier integrated circuits. The differential read or input of the signal voltage offers very wide band attenuation of the common-mode noise even when equalization circuits cause impedance imbalances on the input pins.

Moreover, it will be appreciated that that many differential drive or bride-tied load (BTL) configurations could provide the differential output arrangement of the present invention. Some dual power amplifier integrated circuits have gain setting configurations that allow the inverting input of one amplifier to be tied to the non-inverting input of the other amplifier for differential output drive. Other configurations simply voltage divide the output of the non-inverting amplifier and feed this signal into the inverting input of the second amplifier. Still other integrated circuits offer amplifier pairs as one inverting and the other non-inverting, and differential output is obtained by connecting two inputs to the same signal source.

Having described and illustrated the principles of our invention with reference to a preferred embodiment thereof, it will be apparent that the invention can be modified in arrangement and detail without departing from such principles. In view of the many possible embodiments to which the principles may be put, it should be recognized that the detailed embodiment is illustrative only and should not be taken as limiting the scope of our invention. Accordingly, we claim as our invention all such modifications as may come within the scope and spirit of the following claims and equivalents thereto.

What is claimed is:

1. In a multimedia computer speaker system having a speaker for transducing an audio signal from an audio output circuit of a multimedia computer, the improvement comprising:
a pair of amplifiers with differential connections for receiving the audio signal and with differential output connections to the speaker to provide it with differential amplification, the pair of amplifiers including power connections that are connectable to a power source having a power source ground and the audio signal is provided with reference to an audio system ground that is electrically non-identical to the power source ground.

2. The system of claim 1 in which the amplifier power connections are connectable to a power source included in the multimedia computer.

3. The system of claim 1 in which the audio signal is provided with reference to an audio system ground and the pair of amplifiers includes first and second amplifiers that each have inverting and non-inverting inputs, the first amplifier receiving the audio signal at the non-inverting input, the inverting input of the second amplifier being coupled to the audio system ground, and the first and second amplifiers being connected together so that both amplifiers will only amplify the difference signal between the audio signal and the audio system ground.

4. The system of claim 3 in which the pair of amplifiers includes power connections that are connectable to a power source that is included in the multimedia computer.

5. The system of claim 1 in which the pair of amplifiers includes power connections that are connectable to a power source that is included in the multimedia computer.

6. The system of claim 5 in which the power connections conform to a power-available port of the multimedia computer.

7. The system of claim 5 in which the power connections conform to a universal serial bus port of the multimedia computer.

8. The system of claim 5 in which the power connections conform to a IEEE 1394 port of the multimedia computer.

9. The system of claim 1 in which the audio signal corresponds to one of multiple audio signal channels, the system further comprising for each audio signal channel a pair of amplifiers with differential connections for receiving the audio signal and with differential output connections to the speaker to provide it with differential amplification.

10. In a multimedia computer speaker system having a speaker for transducing an audio signal from an audio output circuit of a multimedia computer, the improvement comprising:
- a pair of amplifiers with differential connections for receiving the audio signal and with differential output connections to the speaker to provide it with differential amplification; and
- a DC power coupling for receiving DC power from a power source that is included in the multimedia computer,
- the audio signal being provided with reference to an audio system ground and the pair of amplifiers includes first and second amplifiers that each have inverting and non-inverting inputs, the first amplifier receiving the audio signal at the non-inverting input, the inverting input of the second amplifier being coupled to the audio system ground, and the first amplifier end second amplifier being connected together so that both amplifiers will only amplify the difference signal between the audio signal and the audio system ground.

11. The system of claim 10 in which the power source has a power source ground and the audio signal is provided with reference to an audio system ground that is electrically different from the power source ground.

12. The system of claim 10 in which the audio signal corresponds to one of multiple audio signal channels, the system further comprising for each audio signal channel a pair of amplifiers with differential connections for receiving the audio signal and with differential output connections to the speaker to provide it with differential amplification.

13. In a multimedia computer speaker system having a speaker for transducing an audio signal from an audio output circuit of a multimedia computer, a method of driving the speaker, comprising:
- differentially applying the audio signal to a pair of amplifiers that each have an amplifier output; and
- differentially coupling the amplifier outputs to the speaker,
- the pair of amplifiers including power connections that are connectable to a power source having a power source ground and the audio signal being provided with reference to an audio system ground that is electrically different from the power source ground.

14. The method of claim 13 further comprising connecting the amplifier power connections to a power source included in the multimedia computer.

15. The method of claim 13 in which the pair of amplifiers includes first and second amplifiers that each have inverting and non-inverting inputs, the method further comprising providing the audio signal with reference to an audio system ground, applying the audio signal to the non-inverting input of the first amplifier, coupling the inverting input of the second amplifier to the audio system ground, and coupling the first amplifier and second amplifier being connected together so that both amplifiers will only amplify the difference signal between the audio signal and the audio system ground.

16. The method of claim 15 in which the pair of amplifiers include power connections that are connectable to a power source, the method further comprising coupling power connections to a power source that is included in the multimedia computer.

17. The method of claim 13 in which the pair of amplifiers include power connections that are connectable to a power source, the method further comprising coupling power connections to a power source that is included in the multimedia computer.

18. In an amplified multimedia computer speaker system having an amplified speaker for transducing an audio signal from an audio output circuit of a multimedia computer, the improvement comprising:
- a power connection that conforms to a universal serial bus port of the multimedia computer for powering the multimedia computer speaker system.

19. In an amplified multimedia computer speaker system having an amplified speaker for transducing an audio signal from an audio output circuit of a multimedia computer, the improvement comprising:
- a power connection that conforms to a IEEE 1394 port of the multimedia computer for powering the multimedia computer speaker system.

20. A differential stereo audio amplification system connectable to an audio speaker, the improvement comprising:
- a pair of amplifiers with differential connections for receiving the audio signal and with differential output connections to the speaker to provide it with differential amplification,
- the pair of amplifiers including power connections that are connectable to a power source having a power source ground and the audio signal being provided with reference to an audio system ground that is electrically non-identical to the power source ground.

21. The system of claim 20 in which the audio signal is provided with reference to an audio system ground and the pair of amplifiers includes first and second amplifiers that each have inverting and non-inverting inputs, the first amplifier receiving the audio signal at the non-inverting input, the inverting input of the second amplifier being coupled to the audio system ground, and the first and second amplifier being connected together so that both amplifiers will only amplify the difference signal between the audio signal and the audio system ground.

22. The system of claim 20 in which the audio signal corresponds to one of two audio signal channels, the system further comprising for each audio signal channel a pair of amplifiers with differential connections for receiving the audio signal and with differential output connections to provide differential amplification.

23. The system of claim 22 comprising a multimedia computer audio speaker for each of the two audio channels.

24. The system of claim 22 comprising two audio speakers for the two audio channels, the two audio speakers being coupled together to form a headphone.

25. The system of claim 22 further comprising couplings for connecting the two audio channels to either of two pair of audio speakers, one pair of audio speakers being included in a headphone.

26. The system of claim 25 further comprising a switch mechanism to switch between the couplings for the two pairs of audio speakers.

* * * * *